(12) United States Patent
Diest et al.

(10) Patent No.: US 11,107,972 B2
(45) Date of Patent: Aug. 31, 2021

(54) NANOVOIDED TUNABLE OPTICS

(71) Applicant: Facebook Technologies, LLC, Menlo Park, CA (US)

(72) Inventors: Kenneth Diest, Kirkland, WA (US); Andrew John Ouderkirk, Redmond, WA (US); Robin Sharma, Redmond, WA (US); Tanya Malhotra, Redmond, WA (US); Barry David Silverstein, Kirkland, WA (US); Christopher Yuan Ting Liao, Seattle, WA (US); Erik Shipton, Kenmore, WA (US); Gregory Olegovic Andreev, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 126 days.

(21) Appl. No.: 16/262,439

(22) Filed: Jan. 30, 2019

(65) Prior Publication Data

US 2020/0183200 A1 Jun. 11, 2020

Related U.S. Application Data

(60) Provisional application No. 62/777,825, filed on Dec. 11, 2018.

(51) Int. Cl.
*G02F 1/01* (2006.01)
*H01L 41/193* (2006.01)
(Continued)

(52) U.S. Cl.
CPC ............ *H01L 41/193* (2013.01); *C08F 14/20* (2013.01); *C08F 14/22* (2013.01); *C08G 77/04* (2013.01);
(Continued)

(58) Field of Classification Search
CPC ......... C08G 77/04; G06F 3/011; H04R 17/00; G02F 1/0102; G02F 1/061; C08F 14/20;
(Continued)

(56) References Cited

U.S. PATENT DOCUMENTS 5,095,515 A 3/1992 Seaver
6,420,441 B1 7/2002 Allen et al.
(Continued)

OTHER PUBLICATIONS

Mullin et al., "Pattern Transformation Triggered by Deformation", Physical Review Letters, vol. 99, No. 8, 2007, 4 pages.
(Continued)

*Primary Examiner* — William R Alexander
(74) *Attorney, Agent, or Firm* — FisherBroyles, LLP

(57) ABSTRACT

An optical element includes a nanovoided polymer layer having a first refractive index in an unactuated state and a second refractive index different than the first refractive index in an actuated state. Compression or expansion of the nanovoided polymer layer, for instance, can be used to reversibly control the size and shape of the nanovoids within the polymer layer and hence tune its refractive index over a range of values, e.g., during operation of the optical element. Various other apparatuses, systems, materials, and methods are also disclosed.

18 Claims, 10 Drawing Sheets

(51) Int. Cl.
- *H01L 41/09* (2006.01)
- *H01L 41/047* (2006.01)
- *H04R 17/00* (2006.01)
- *G02B 27/01* (2006.01)
- *G02F 1/061* (2006.01)
- *G02B 5/08* (2006.01)
- *G02B 5/30* (2006.01)
- *G02B 27/10* (2006.01)
- *G06F 3/01* (2006.01)
- *C08F 14/20* (2006.01)
- *C08F 14/22* (2006.01)
- *C08G 77/04* (2006.01)
- *H01L 41/083* (2006.01)
- *H01L 41/18* (2006.01)
- *C08L 83/04* (2006.01)
- *B82Y 30/00* (2011.01)
- *B82Y 40/00* (2011.01)

(52) U.S. Cl.
CPC .............. *G02B 5/08* (2013.01); *G02B 5/3083* (2013.01); *G02B 27/0172* (2013.01); *G02B 27/0176* (2013.01); *G02B 27/10* (2013.01); *G02F 1/0102* (2013.01); *G02F 1/061* (2013.01); *G06F 3/011* (2013.01); *H01L 41/047* (2013.01); *H01L 41/0472* (2013.01); *H01L 41/083* (2013.01); *H01L 41/09* (2013.01); *H01L 41/0913* (2013.01); *H01L 41/0986* (2013.01); *H01L 41/18* (2013.01); *H04R 17/00* (2013.01); *B82Y 30/00* (2013.01); *B82Y 40/00* (2013.01); *C08L 83/04* (2013.01); *G02B 2027/0178* (2013.01); *G02F 2202/022* (2013.01)

(58) Field of Classification Search
CPC ......... C08F 14/22; G02B 5/08; G02B 5/3083; G02B 27/0172; G02B 27/0176; G02B 27/10; H01L 41/047; H01L 41/0472; H01L 41/083; H01L 41/09; H01L 41/0913; H01L 41/0986; H01L 41/18
USPC ........................................................ 359/245
See application file for complete search history.

(56) References Cited

U.S. PATENT DOCUMENTS

| | | | |
|---|---|---|---|
| 6,628,850 | B1 | 9/2003 | Yao |
| 7,230,771 | B2* | 6/2007 | Kuiper ..................... G02B 3/14 359/245 |
| 8,477,402 | B2 | 7/2013 | Duncan et al. |
| 8,848,280 | B2 | 9/2014 | Arsenault |
| 9,228,822 | B2 | 1/2016 | Majidi et al. |
| 10,670,782 | B2 | 6/2020 | Arbabi et al. |
| 10,690,946 | B2 | 6/2020 | Wilson |
| 10,749,448 | B2 | 8/2020 | Lindsay et al. |
| 11,022,856 | B1 | 6/2021 | Ouderkirk et al. |
| 11,025,175 | B1 | 6/2021 | Landig et al. |
| 2002/0009251 | A1* | 1/2002 | Byrne ................... G02F 1/0316 385/2 |
| 2002/0135863 | A1 | 9/2002 | Fukshima et al. |
| 2002/0186928 | A1 | 12/2002 | Curtis |
| 2005/0196552 | A1* | 9/2005 | Lehmann ................. G02B 1/111 428/1.1 |
| 2006/0024976 | A1 | 2/2006 | Waldfried et al. |
| 2006/0028734 | A1* | 2/2006 | Kuiper ................. G02B 26/005 359/676 |
| 2007/0020404 | A1 | 1/2007 | Seiberle et al. |
| 2007/0263963 | A1 | 11/2007 | Hughes et al. |
| 2008/0137031 | A1 | 6/2008 | Hillis et al. |
| 2008/0171431 | A1 | 7/2008 | Yu et al. |
| 2008/0197518 | A1* | 8/2008 | Aylward ............... G02B 5/3083 264/1.34 |
| 2008/0224103 | A1 | 9/2008 | Arsenault et al. |
| 2009/0034051 | A1 | 2/2009 | Arsenault et al. |
| 2009/0296188 | A1* | 12/2009 | Jain ...................... G02B 5/1871 359/245 |
| 2010/0075056 | A1 | 3/2010 | Axisa et al. |
| 2011/0149410 | A1 | 6/2011 | Blum |
| 2011/0242638 | A1 | 10/2011 | Horning et al. |
| 2012/0019185 | A1 | 1/2012 | Guidarelli et al. |
| 2012/0029416 | A1 | 2/2012 | Parker et al. |
| 2012/0200931 | A1 | 8/2012 | Haag et al. |
| 2012/0298200 | A1 | 11/2012 | Niggemann et al. |
| 2013/0202867 | A1 | 8/2013 | Coggio et al. |
| 2013/0222881 | A1 | 8/2013 | Aizenberg et al. |
| 2013/0279151 | A1* | 10/2013 | Ouderkirk ............... H01L 33/60 362/84 |
| 2013/0335807 | A1 | 12/2013 | Arsenault et al. |
| 2014/0133010 | A1 | 5/2014 | Han et al. |
| 2014/0204372 | A1 | 7/2014 | Pang et al. |
| 2014/0217539 | A1* | 8/2014 | Rantala ............... H01L 27/1462 257/432 |
| 2014/0234995 | A1* | 8/2014 | Li ......................... G02F 1/025 438/22 |
| 2014/0266647 | A1 | 9/2014 | Visitacion et al. |
| 2015/0109657 | A1 | 4/2015 | Baumberg et al. |
| 2015/0205126 | A1 | 7/2015 | Schowengerdt |
| 2015/0241698 | A1 | 8/2015 | Schowengerdt |
| 2015/0315012 | A1 | 11/2015 | Wiersma et al. |
| 2016/0103341 | A1* | 4/2016 | Long ..................... G02F 1/0136 359/244 |
| 2016/0187985 | A1 | 6/2016 | Lim et al. |
| 2016/0283773 | A1 | 9/2016 | Popovich et al. |
| 2017/0023807 | A1 | 1/2017 | Chang-Hasnain et al. |
| 2017/0031078 | A1* | 2/2017 | Thompson ........... G02B 6/0066 |
| 2017/0090570 | A1 | 3/2017 | Rain et al. |
| 2017/0192595 | A1 | 7/2017 | Choi et al. |
| 2017/0285348 | A1 | 10/2017 | Ayres et al. |
| 2017/0365630 | A1* | 12/2017 | Yang ................... H01L 27/14621 |
| 2018/0093456 | A1 | 4/2018 | Van Overmeere et al. |
| 2018/0164627 | A1 | 6/2018 | Oh |
| 2018/0356303 | A1* | 12/2018 | Li ......................... G06F 3/0447 |
| 2019/0296218 | A1* | 9/2019 | Ouderkirk ............... H01L 41/09 |
| 2019/0361318 | A1 | 11/2019 | Johnson et al. |
| 2020/0076328 | A1 | 3/2020 | Cha et al. |
| 2020/0183168 | A1 | 6/2020 | Spann et al. |
| 2020/0183199 | A1* | 6/2020 | Diest ..................... C08G 77/04 |
| 2020/0183200 | A1 | 6/2020 | Diest et al. |
| 2020/0185590 | A1 | 6/2020 | Malhotra et al. |

OTHER PUBLICATIONS

Babaee et al., "3D Soft Metamaterials with Negative Poisson's ratio", Advanced Materials, vol. 25, No. 36, 2013, 18 pages.
Bertoldi et al., "Novel negative Poisson's ratio behavior induced by an elastic instability", Advanced Materials, vol. 22, No. 3, 2010, pp. 1-11.
Overvelde et al., "Relating pore shape to the non-linear response of periodic elastomeric structures", Journal of the Mechanics and Physics of Solids, vol. 64, 2014, 16 pages.
Shen et al., "Simple cubic three-dimensional auxetic metamaterials", Physic. Status Solidi (B), vol. 251, No. 8, 2014, pp. 1515-1522.
Correa et al., "Negative Stiffness Honeycombs for Recoverable Shock Isolation", Rapid Prototyping Journal, vol. 21, No. 2, 2015, pp. 702-713.
Coulais et al., "Discontinuous Buckling of Wide Beams and Metabeams", Physical Review Letters, vol. 115, 2015, 7 pages.
Bickel et al., "Design and Fabrication of Materials with Desired Deformation Behavior", ACM Transactions on Graphics (TOG), vol. 29, No. 4, Jul. 2010, 10 pages.
Rosset et al., "Small, fast, and tough: Shrinking down integrated elastomer transducers", Applied Physics Reviews, vol. 3, No. 3, 2016, pp. 1-27.
Plante et al., "Large-scale failure modes of dielectric elastomer actuators", International Journal of Solids and Structures, vol. 43, 2006, pp. 7727-7751.

(56) References Cited

OTHER PUBLICATIONS

"Optotune DEAPs", Electroactive polymers, URL: https://www.optotune.com/technology/electroactive-polymers, 2019, 3 pages.
Product—Novasentis, "EMP Haptic Actuators for Sensory Innovation", URL: https://www.novasentis.com/product, 2019, 4 pages.
Rosset et al., "Mechanical characterization of a dielectric elastomer microactuator with ion-implanted electrodes", Sensor and Actuators A 144, 2008, 25 pages.
Gerratt et al., "Dielectric breakdown of PDMS thin films", Journal of Micromechanics and Microengineering, vol. 23, Apr. 26, 2013, 8 pages.
Hunt et al., "A self-healing dielectric elastomer actuator", Applied Physics Letters, vol. 104, 2014, 4 pages.
Skov et al., "Optimization Techniques for Improving the Performance of Silicone-Based Dielectric Elastomers", Advanced Engineering Materials, vol. 20, 2018, pp. 1-21.
Mazurek et al., "Glycerol as high-permittivity liquid filler in dielectric silicone elastomers", Journal of Applied Polymer Science, vol. 133, No. 43, 2016, 28 pages.
Rao et al., "Synthesis of flexible silica aerogels using methyltrimethoxysilane (MTMS) precursor", Journal of Colloid and Interface Science, vol. 300, 2006, pp. 279-285.
Seo et al., "Reticulated Nanoporous Polymers by Controlled Polymerization-Induced Microphase Separation", Science, vol. 336, Jun. 15, 2012, 5 pages.
Jennings, S.G., "The mean free path in air", Journal of Aerosol Science, vol. 19, No. 2, 1988, pp. 1-2.
Gupta et al., "Nanoemulsions: formation, properties and applications", Soft Matter, 2016, 16 pages.
Helgeson et al., "Mesoporous organohydrogels from thermogelling photocrosslinkable nanoemulsions", Nature Materials, vol. 11, Apr. 2012, pp. 344-352.
Guha et al., "Creating nanoscale emulsions using condensation", Nature Communications, 8:1371, 2017, pp. 1-7.
Meier et al., "Microemulsion elastomers", Colloid Polymer Science, vol. 274, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethyoxysilane-based Silica Aerogels by Two-step sol-gel process", Journal Microelectron, vol. 23, No. 1, 2016, pp. 35-39.
Moore, Duncan T., "Gradient Index Optics", Optical Elements, IVPV Handbook of Optics, 2nd Edition, vol. II—Devices, Measurements, and Properties, 1995, pp. 9.1-9.10.
Nguyen et al., "Synthesis, Processing, and Characterization of Inorganic-Organic Hybrid Cross-Linked Silica, Organic Polyimide, and Inorganic Aluminosilicate Aerogels", National Aeronautics and Space Administration STI Program, NASA/CR-2014-218328, Jul. 2014, 58 pages.
Shatz, Narkis, "Gradient-Index Optics", Science Applications International Corp., Final Report, Mar. 31, 2010, 103 pages.
Teichman et al., "Gradient Index Optics at Darpa", Institute for Defense Analyses, IDA Document D-5027, Nov. 2013, 69 pages.
Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.
Matyka et al., "How to Calculate Tortuosity Easily?", AIP Conference Proceedings, Mar. 26, 2012, 6 pages.
Cheng et al., "Controlled in Situ Nanocavitation in Polymeric Materials", Advanced Materials, vol. 23, Jan. 2011, pp. 409-413.
Solans et al., "Nano-emulsions: Formation by low-energy methods", Colloid & Interface Science, vol. 17, Issue 5, Oct. 2012, pp. 246-254.
Fuse et al., "Possible Mechanism of Superior Partial-Discharge Resistance of Polyamide Nanocomposites", Annual Report Conference on Electrical Insulation and Dielectric Phenomena, 2004, pp. 322-325.
Wu et al., "3D Printed Silicones with Shape Memory", Scientific Reports, vol. 7, No. 4664, Jul. 5, 2017, pp. 1-6.
Johnson et al., "A brief review of atomic layer deposition:from fundamentals to applications", Materials Today, vol. 17, No. 5, Jun. 2014, pp. 236-246.
Sole et al., "Nano-emulsions prepared by the phase inversion composition method: Preparation variables and scale up", Journal of Colloid and Interface Science, vol. 344, 2010, pp. 417-423.
Camino et al., "Polydimethylsiloxane thermal degradation Part 1. Kinetic aspects", Polymer, vol. 42, 2001, pp. 2395-2402.
Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.
Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.
Waldem et al., "Digilens Switchable Bragg grating waveguide optics for augmented reality applications", Proc. SPIE 10676, Digital optics for Immersive Displays, May 21, 2018, 1 page.
International Search Report and Written Opinion received for PCT Application Serial No. PCT/US2019/064367 dated Mar. 11, 2020, 17 pages.
Ouderkirk et al., "Nanovoided Graded-Index Optical Elements, Optical Arrays, and Methods of Forming the Same", U.S. Appl. No. 16/426,737, filed May 30, 2019, 113 pages.
Diest et al., "Polymer Materials Including Coated Nanovoids and Methods and Systems for Forming the Same", U.S. Appl. No. 16/512,335, filed Jul. 15, 2019, 133 pages.
Sharma et al., "Switchable Electroactive Devices for Head-Mounted Displays", U.S. Appl. No. 16/351,477, filed Mar. 12, 2019, 108 pages.
Spann et al., "Nanovoided Polymers Having Shaped Voids", U.S. Appl. No. 16/703,674, filed Dec. 4, 2019, 149 pages.
Landig et al., "Planarization Layers for Nanovoided Polymers", U.S. Appl. No. 16/364,977, filed Mar. 26, 2019, 125 pages.
Ouderkirk et al., "Waveguide with Switchable Input", U.S. Appl. No. 16/263,829, filed Jan. 31, 2019, 55 pages.
Landig et al., "Multiple Layers Between Electrodes Including Nanovoided Polymer", U.S. Appl. No. 16/386,232, filed Apr. 16, 2019, 126 pages.
Landig et al., "Nanovoided Polymers Using Phase Inversion", U.S. Appl. No. 16/449,964, filed Jun. 24, 2019, 139 pages.
Spann et al., "Reduced Hysteresis and Reduced Creep in Nanovoided Polymer Devices", U.S. Appl. No. 16/703,291, filed Dec. 4, 2019, 152 pages.
Diest et al., "Nanovoided Tunable Birefringence", U.S. Appl. No. 16/262,433, filed Jan. 30, 2019, 51 pages.
Malhotra et al., "Spatially Addressable Nanovoided Polymers", U.S. Appl. No. 16/417,911, filed May 21, 2019, 138 pages.
Landig et al., "Fabrication of Shaped Voids", U.S. Appl. No. 16/669,970, filed Oct. 31, 2019, 110 pages.
International Search Report and Written Opinion received for PCT Application Serial No. PCT/US2019/064395 dated Mar. 12, 2020, 17 pages.
Si et al., "Liquid-Crystal-Enabled Active Plasmonics: A Review", Materials, vol. 7, No. 2, Feb. 18, 2014, pp. 1296-1317.
Crawford, Gregory P., "Electrically Switchable Bragg Gratings", Optics & Photonics News, Apr. 30, 2003, pp. 54-59.
Dickson et al., "Electronically Controlled Surface Plasmon Dispersion and Optical Transmission through Metallic Hole Arrays Using Liquid Crystal", NANO Letters, vol. 8, No. 1, Jan. 1, 2008, pp. 281-286.
Non-Final Office Action received for U.S. Appl. No. 16/351,477 dated Jun. 23, 2020, 27 pages.
Fratzl et al., "The mechanics of tessellations—bioinspired strategies for fracture resistance", Chem Soc Rev., vol. 15, No. 2, Jan. 21, 2016, pp. 252-267.
Gohtani et al., "Nano-Emulsions; Emulsification Using Low Energy Methods", Japan Journal of Food Engineering, vol. 15, No. 3, Sep. 1, 2014, pp. 119-130.

(56) References Cited

OTHER PUBLICATIONS

Michler et al., "The physics and micro-mechanics of nano-voids and nano-particles in polymer combinations", ScienceDirect, Polymer, vol. 54, No. 13, Jun. 7, 2013, pp. 1-14.
Zhu et al., "Large deformation and electromechanical instability of a dielectric elastomer tube actuator", Journal of Applied Physics, vol. 108, Issue 7, Article 074113, Oct. 13, 2010, pp. 1-6.
Cameron et al., "Linear actuation in coextruded dielectric elastomer tubes", ScienceDirect, Sensors and Actuators A: Physical, vol. 147, Issue 1, Sep. 15, 2008, pp. 286-291.
Cattmull et al., "Recursively generated B-spline surfaces on arbitrary topological meshes", Computer-Aided Design, vol. 10, No. 6, Nov. 1, 1978, pp. 183-188.
Loop, Charles Teorell, "Smooth Subdivision Surfaces Based on Triangles", Thesis, Master of Science, University of Utah, Aug. 1, 1987, 74 pages.
Merkel et al., "Gas Sorption, Diffusion, and Permeation in Poly(dimethylsiloxane)", Journal of Polymer Science: Part. 3: Polymer Physics, vol. 38, Feb. 1, 2000, pp. 415-434.
Kim et al., "Mathematical analysis of oxygen transfer through polydimethylsiloxane membrane between double layers of cell culture channel and gas chamber in microluidic oxygenator", Microfluidics and Nanofluidics, vol. 15, Feb. 1, 2013, 39 pages.
Cruz-Hernandez et al., "Phase Control Approach to Hysteresis Reduction", IEEE Transactions on Control Systems Technology, vol. 9, No. 1, Jan. 1, 2001, pp. 17-26.
Zuev, Yu.S., "Elastomer-gas systems", International Polymer Science and Technology, vol. 28, No. 2, Feb. 1, 2001, pp. 43-53.
Shir, Daniel Jay-Lee et, "Three-Dimensional Nanofabrication with Elastomeric Phase Masks", PhD Thesis, University of Illinois at Urbana-Champaign, Oct. 17, 2007, 138 pages.
U.S. Appl. No. 16/263,829, filed Jan. 31, 2019.
U.S. Appl. No. 16/351,477, filed Mar. 12, 2019.
U.S. Appl. No. 16/426,737, filed May 30, 2019.
U.S. Appl. No. 16/512,335, filed Jul. 15, 2019.
Jeon et al., "Three dimensional nanoporous density graded materials formed by optical exposures through conformable phase masks", Applied Physics Letters, vol. 89, Article 253101, Dec. 18, 2006, pp. 1-3.
Sultan et al., "Electrical Breakdown Testing of Materials Intended for use in PV Modules", 3rd Atlas/NIST Workshop on Photovoltaics, Dec. 8-9, 2015, 29 pages.
Sekitani et al., "Stretchable active-matrix organic light-emitting diode display using printable elastic conductors", Nature Materials, vol. 8, May 10, 2009, pp. 494-499.
Someya et al., "Conformable, flexible, large-area networks of pressure and thermal sensors with organic transistor active matrixes", PNAS, vol. 102, No. 35, Aug. 30, 2005, pp. 12321-12325.
Wegener et al., "Controlled inflation of voids in cellular polymer ferroelectrets: Optimizing electromechanical transducer properties", Applies Physics Letters, vol. 84, No. 3, Jan. 19, 2004, pp. 392-394.
Wu et al., "Fabrication of ultralong perovskite structure nanotubes", RSC Advances, vol. 8, Jan. 2, 2018, pp. 367-373.
Wu et al., "Efficient multi-barrier thin film encapsulation of OLED using alternating Al2O3 and polymer layers", RSC Advances, vol. 8, Feb. 2, 2018, pp. 5721-5727.
Yang et al., "Harnessing Surface Wrinkle Patterns in Soft Matter", Advanced Functional Materials, vol. 20, Jul. 29, 2010, pp. 2550-2564.
Zhang et al., "Highly Porous Polyhedral Silsesquioxane Polymers. Synthesis and Characterization", J. Am. Chem. Soc., vol. 120, Aug. 11, 1998, pp. 8380-8391.
Yang et al., "Avoiding the pull-in instability of a dielectric elastomer film and the potential for increased actuation and energy harvesting", Soft Matter, vol. 13, Jan. 6, 2017, pp. 4552-4558.
Jang et al., "Mechanically Tunable Three-Dimensional Elastomeric Network/Air Structures via Interference Lithography", Nano Letters, vol. 6, No. 4, Mar. 15, 2006, pp. 740-743.
Rogers et al., "Materials and Mechanics for Stretchable Electronics", Science, vol. 327, Mar. 26, 2010, pp. 1603-1607.
Wolak et al., "Dielectric response of structured multilayered polymer films fabricated by forced assembly", Applied Physics Letters, vol. 92, Article 113301, Mar. 17, 2008, pp. 1-3.
Mackey et al., "Enhanced breakdown strength of multilayered films fabricated by forced assembly microlayer coextrusion", Journal of Physics D: Applied Physics, vol. 42, Article 175304, Aug. 12, 2009, pp. 1-12.
Ieda, Masayuki, "Dielectric Breakdown Process of Polymers", IEEE Transactions on Electrical Insulation, vol. El-15, No. 3, Jun. 1980, pp. 206-224.
Non-Final Office Action received for U.S. Appl. No. 16/364,977 dated Oct. 19, 2020, 38 pages.
Final office action received for U.S. Appl. No. 16/351,477 dated Dec. 1, 2020, 38 pages.
Preinterview first office action received for U.S. Appl. No. 16/263,829 dated Dec. 22, 2020, 36 pages.
Non-Final office action received for U.S. Appl. No. 16/449,964 dated Nov. 24, 2020, 91 pages.
Holda et al., "Understanding and guiding the phase inversion process for synthesis of solvent resistant nanofiltration membranes", J. Appl. Polym. Sci. 42130, 2015, 17 pages.
Struzynska-Piron et al., "Synthesis of solvent stable polymeric membranes via UV depth-curing", Chem. Commun., vol. 49, 11494, 2013, 3 pages.
Preinterview first office action received for U.S. Appl. No. 16/262,433 dated Oct. 26, 2020, 58 pages.
Notice of Allowance received for U.S. Appl. No. 16/364,977 dated Feb. 2, 2021, 40 pages.
Notice of Allowance received for U.S. Appl. No. 16/263,829 dated Feb. 4, 2021, 27 pages.
Notice of Allowance received for U.S. Appl. No. 16/449,964 dated Mar. 4, 2021, 21 pages.
First Action Interview received for U.S. Appl. No. 16/262,433 dated Mar. 1, 2021, 12 pages.
Notice of Allowance received for U.S. Appl. No. 16/351,477 dated Mar. 29, 2021, 28 pages.
Notice of Allowance received for U.S. Appl. No. 16/703,291 dated Jun. 3, 2021, 61 pages.
Final Office Action received for U.S. Appl. No. 16/262,433 dated May 25, 2021, 30 pages.
Wilson et al., "Variable Wave Plate via Tunable Form-Birefringent Structures", Journal of Microelectromechanical Systems, vol. 17, No. 4, Aug. 2008, pp. 1039-1046.
International Preliminary Report on Patentability received for PCT Application Serial No. PCT/US2019/064395 dated Jun. 24, 2021, 10 pages.
International Preliminary Report on Patentability received for PCT Application Serial No. PCT/US2019/064367 dated Jun. 24, 2021, 10 pages.

* cited by examiner

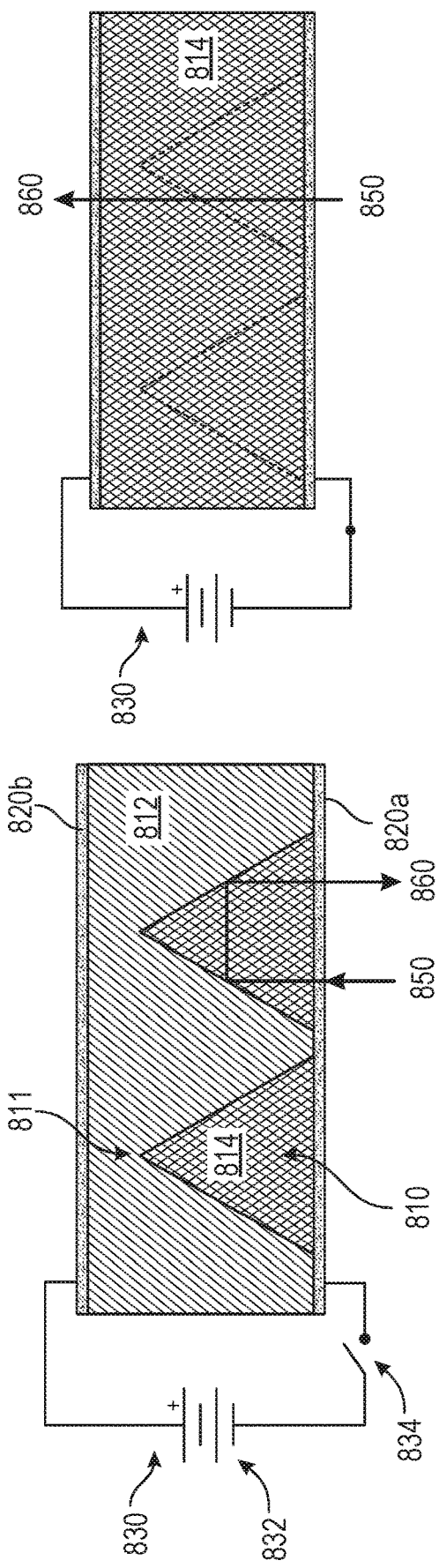

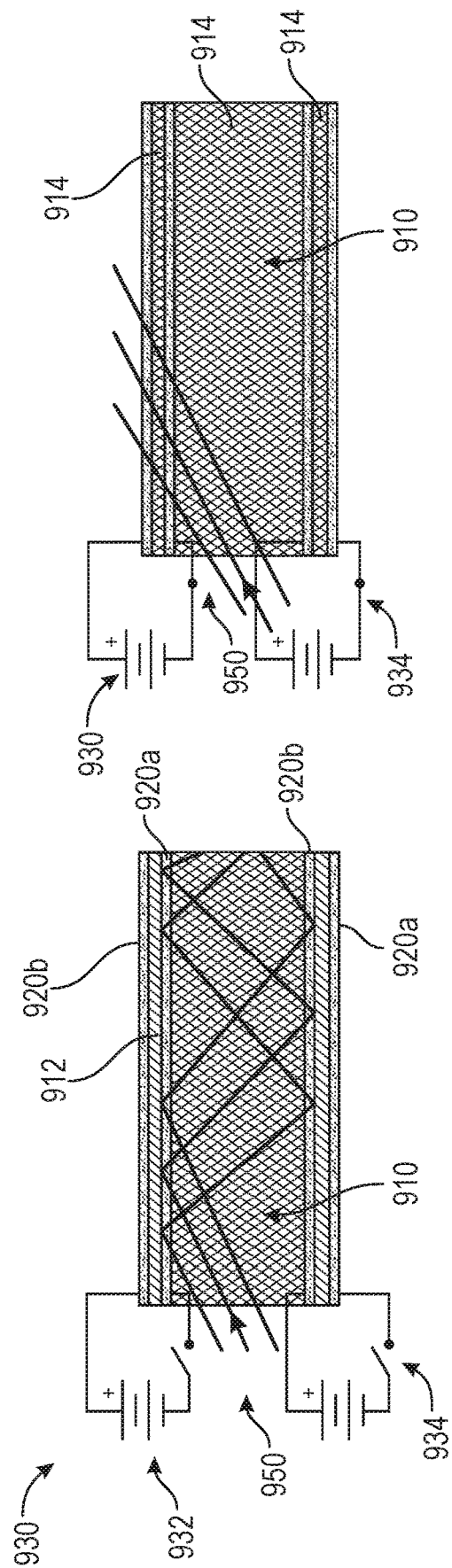

NANOVOIDED TUNABLE OPTICS

CROSS-REFERENCE TO RELATED APPLICATION

This application claims the benefit of priority under 35 U.S.C. § 119(e) of U.S. Provisional Application No. 62/777,825, filed Dec. 11, 2018, the contents of which are incorporated herein by reference in their entirety.

BACKGROUND

Polymer materials may be incorporated into a variety of different optic and electro-optic architectures, including active and passive optics and electroactive devices. Electroactive polymer (EAP) materials, for instance, may change their shape under the influence of an electric field. EAP materials have been investigated for use in various technologies, including actuation, sensing and/or energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including their electrical, mechanical, and/or optical properties. Notwithstanding recent developments, it would be advantageous to provide polymer or other dielectric materials having improved attributes, including dynamic, tunable optical properties.

SUMMARY

As will be described in greater detail below, the present disclosure relates to optical elements and methods of manufacturing optical elements that include nanovoided polymer materials. The nanovoided polymer materials may include electroactive materials, such as dielectric elastomers suitable for use in electroactive devices including, for example, polydimethylsiloxane (PDMS)-based polymers. Actuation of the nanovoided polymer materials may be used to reversibly control the size and shape of nanovoids within the polymer matrix and thereby modify the effective refractive index of a layer of nanovoided polymer material. Thus, in certain embodiments, the disclosure relates to switchable optical elements where the refractive index of the nanovoided polymer may be reversibly tuned during operation of the optical element.

According to certain embodiments, an optical element includes a layer of a nanovoided polymer where the nanovoided polymer has a first refractive index in an unactuated state and a second refractive index different than the first refractive index in an actuated state. The nanovoided polymer may be capacitively actuated, for example, or actuated mechanically or acoustically. The nanovoided polymer layer may be patterned, e.g., dimensionally structured, to affect the desired interaction with light in both the unactuated and the actuated state. For instance, the nanovoided polymer layer may be patterned using photolithography to have a prismatic shape.

For capacitive actuation, the optical element may further include a primary electrode and a secondary electrode that overlaps at least a portion of the primary electrode, where the nanovoided polymer layer is disposed between and abuts the primary electrode and the secondary electrode.

In some embodiments, the optical element may further include a dielectric layer adjacent to the nanovoided polymer layer. The dielectric layer may overlie or underlie the nanovoided polymer layer and may include a second nanovoided polymer layer or an un-voided (e.g., substantially dense) polymer layer. The dielectric layer may be disposed directly over the nanovoided polymer layer, for example. In some embodiments, the dielectric layer may be a gaseous layer such as an air gap. The dielectric layer may be selected such that the refractive index of the dielectric layer is equal to the first refractive index or equal to the second refractive index. That is, the dielectric layer may be chosen to be index-matched with the actuated or un-actuated nanovoided polymer.

According to further embodiments, an optical element includes a primary electrode, a secondary electrode overlapping at least a portion of the primary electrode, a nanovoided polymer layer disposed between and abutting the primary electrode and the secondary electrode, and a dielectric layer adjacent to the nanovoided polymer layer, where the nanovoided polymer layer has a first refractive index when a first voltage is applied between the primary electrode and the secondary electrode, and the nanovoided polymer layer has a second refractive index different from the first refractive index when a second voltage different from the first voltage is applied between the primary electrode and the secondary electrode. In certain embodiments, the nanovoided polymer layer may be a structured layer. According to some embodiments, the nanovoided polymer layer may have a uniform or a non-uniform void topology.

An example method for manufacturing an optical element includes forming a structured nanovoided polymer layer having a first refractive index and deforming the structured nanovoided polymer layer in at least one dimension to form a deformed nanovoided polymer layer having a second refractive index different from the first refractive index.

Features from any of the these or other embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 8A is a schematic diagram of an example optical element including a structured dielectric layer and an overlying layer of a nanovoided polymer material showing the interaction of light prior to compression of the nanovoided polymer material layer according to certain embodiments.

FIG. 8B is a schematic diagram of the optical element of FIG. 8A following capacitive actuation and compression of the overlying nanovoided polymer material layer and the resultant impact on the path of light through the optical element in accordance with some embodiments.

FIG. 9A is a schematic diagram of an example optical element including a polymer material layer and upper and lower cladding layers of a nanovoided polymer exhibiting total internal reflection of light passing through the optical element according to certain embodiments.

FIG. 9B is a schematic diagram of the optical element of FIG. 9A showing the change in the path of light through the optical element following capacitive actuation and compression of the nanovoided polymer cladding layers according to certain embodiments.

Figure 1B:
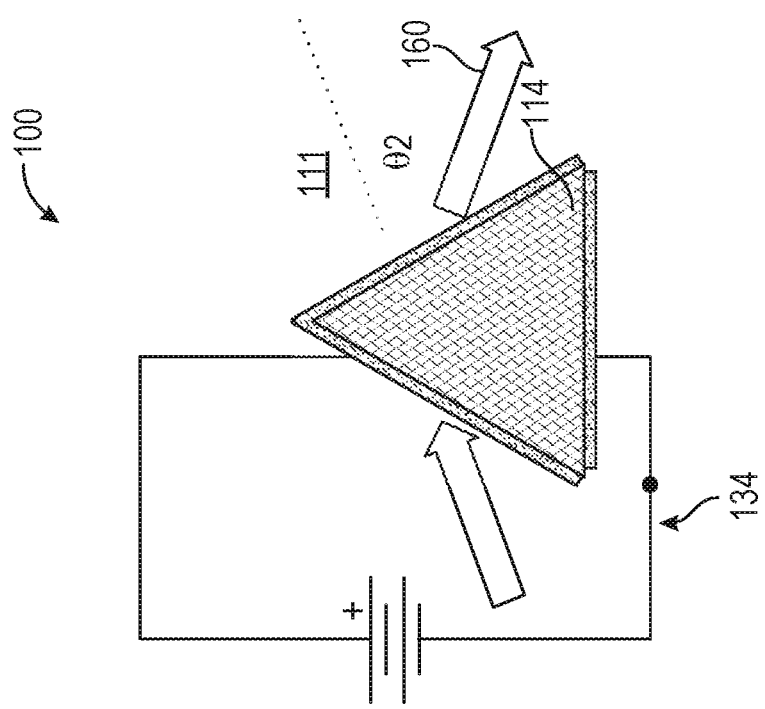
FIG. 1B is a schematic diagram of the optical element of FIG. 1A following capacitive actuation and compression of the structured polymer layer and showing the resulting change in the light path through the optical element according to certain embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to optical elements that include a nanovoided polymer layer. As used herein, an "optical element" may, in some examples, include a structured or unstructured article configured to interact with light, and may include, without limitation, refractive optics, reflective optics, dispersive optics, polarization optics, or diffractive optics.

According to some embodiments, the nanovoided polymer may be actuated to control the size and shape of the voids within the polymer matrix. Control of the void geometry can be used to control the effective refractive index of the optical element. For instance, a nanovoided polymer layer may have a first effective refractive index in an unactuated state and a second effective refractive index different than the first refractive index in an actuated state.

In contrast to traditional optical materials that may have either a static index of refraction or an index that can be switched between two static states, nanovoided polymers represent a class of optical materials where the index of refraction can be tuned over a range of values to advantageously control the interaction of these materials with light. As used herein, an "effective refractive index" for a composite material (such as a nanovoided polymer) may not be a property of the material per se, but may be determined as a weighted average of the refractive indices of the constituent elements that constitute the composite, i.e., the polymer matrix and air. Such a determination may be made using effective medium theory, for example, as known to those skilled in the art.

In accordance with various embodiments, a nanovoided polymer material may include a polymer matrix and a plurality of nanoscale voids dispersed throughout the matrix. The polymer matrix material may include a deformable, electroactive polymer that may be symmetric with regard to electrical charge (e.g., polydimethylsiloxane (PDMS), acrylates, etc.) or asymmetric (e.g., poled polyvinylidene fluoride (PVDF) or its co-polymers such as poly(vinylidene-fluoride-co-trifluoroethylene) (PVDF-TrFE)). Additional examples of polymer materials forming electroactive polymers may include, without limitation, styrenes, polyesters, polycarbonates, epoxies, halogenated polymers, silicone polymers, and/or other suitable polymer or polymer precursor materials including ethyl acetate, butyl acrylate, octyl acrylate, ethylethoxy ethyl acrylate, 2-chloroethyl vinyl ether, chloromethyl acrylate, methacrylic acid, dimethacrylate oligomers, isocyanates, allyl glycidyl ether, N-methylol acrylamide, or mixtures thereof. Such materials, according to some embodiments, may have a dielectric constant or relative permittivity, such as, for example, a dielectric constant ranging from approximately 1.2 to approximately 30.

One or more of the foregoing precursor materials may be combined in a suitable solvent, optionally with a chemical curing agent. Example solvents include aliphatic, aromatic, or halogenated hydrocarbons, as well as combinations thereof. A curing agent, if provided, may include polyamines, higher fatty acids or their esters, or sulfur, for example.

As used herein, the terminology "nanovoids," "nanoscale voids," "nanovoided," and the like may, in some examples, refer to voids having at least one sub-micron dimension, i.e., a length and/or width and/or depth, of less than 1000 nm. In some embodiments, the void size may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

In example nanovoided polymers, the nanovoids may be randomly distributed throughout the polymer matrix, without exhibiting any long-range order, or the nanovoids may exhibit a regular, periodic structure having a lattice constant of approximately 20 nm to approximately 1000 nm. In both disordered and ordered structures, the nanovoids may be discrete, closed-celled voids, open-celled voids that may be at least partially interconnected, or combinations thereof. For open-celled voids, the void size (d) may be the minimum average diameter of the cell. The voids may be any suitable size and, in some embodiments, the voids may approach the scale of the thickness of the nanovoided polymer layer.

In certain embodiments, the nanovoids may occupy approximately 10% to approximately 90% by volume of the polymer matrix, e.g., approximately 10%, approximately 20%, approximately 30%, approximately 40%, approximately 50%, approximately 60%, approximately 70%, approximately 80%, or approximately 90%, including ranges between any of the foregoing values.

According to some embodiments, the nanovoids may be substantially spherical, although the void shape is not particularly limited. For instance, in addition to, or in lieu of spherical voids, the nanovoided polymer material may include voids that are oblate, prolate, lenticular, ovoid, etc., and may be characterized by a convex and/or a concave cross-sectional shape. Moreover, the topology of the voids throughout the polymer matrix may be uniform or non-uniform. As used herein, the term "topology" may, with reference to the nanovoids, refer to their overall arrangement within the nanovoided polymer and may include their size and shape as well as their respective distribution (density, periodicity, etc.) throughout the polymer matrix. By way of example, the size of the voids and/or the void size distribution may vary spatially within the nanovoided polymer material, i.e., laterally and/or with respect to the thickness of the nanovoided polymer material.

In the presence of an electrostatic field (E-field), an electroactive polymer may deform (e.g., compress, elongate, bend, etc.) according to the magnitude and direction of the applied field. Generation of such a field may be accomplished, for example, by placing the electroactive polymer between two electrodes, i.e., a primary electrode and a secondary electrode, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

The physical origin of the compressive nature of electroactive polymers in the presence of an electrostatic field, being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

In some embodiments, applying a voltage to the electrodes (e.g., the primary electrode and/or the secondary electrode) may create at least approximately 0.1% strain (e.g., an amount of deformation in the direction of the applied force resulting from the applied voltage divided by the initial dimension of the material) in the nanovoided polymer material in at least one direction (e.g., an x, y, or z direction with respect to a defined coordinate system).

In some embodiments, the nanovoids may be filled with a gas to suppress electrical breakdown of the electroactive polymer element (for example, during capacitive actuation). The gas may include air, nitrogen, oxygen, argon, sulfur hexafluoride, an organofluoride and/or any other suitable gas. In some embodiments, such a gas may have a high dielectric strength.

In some embodiments, the application of a voltage to a nanovoided polymer layer may change the internal pressure of gasses within the nanovoided regions thereof. For example, gasses may diffuse either into or out of the nanovoided polymer layer during dimensional changes associated with its deformation. Such changes in the electroactive polymer elements can affect, for example, the hysteresis of an electroactive device incorporating the electroactive polymer during dimensional changes, and also may result in drift when the nanovoided polymer layer's dimensions are rapidly changed.

In some embodiments, the nanovoided composite polymer material may include an elastomeric polymer matrix having an elastic modulus of less than approximately 10 GPa (e.g., approximately 10 GPa, approximately 5 GPa, approximately 2 GPa, approximately 1 GPa, approximately 0.5 GPa, approximately 0.2 GPa, approximately 0.1 GPa, or approximately 0.05 GPa, including ranges between any of the foregoing values).

Polymer materials including voids having nanoscale dimensions may possess a number of advantageous attributes. For example, the incorporation of nanovoids into a polymer matrix may increase the permittivity of the resulting composite. Also, the high surface area-to-volume ratio associated with nanovoided polymers will provide a greater interfacial area between the nanovoids and the surrounding polymer matrix. With such a high surface area structure, electric charge can accumulate at the void-matrix interface, which can enable greater polarizability and, consequently, increased permittivity ($\epsilon_r$) of the composite. Additionally, because ions, such as plasma electrons, can only be accelerated over small distances within nanovoids, the likelihood of molecular collisions that liberate additional ions and create a breakdown cascade is decreased, which may result in the nanovoided material exhibiting a greater breakdown strength than un-voided or even macro-voided dielectrics.

Various manufacturing methods may be used to form nanovoided polymer materials, such as nanovoided polymer thin films having a disordered arrangement of nanovoids or an ordered arrangement of nanovoids. Methods for forming nanovoided polymer thin films having randomly-distributed (i.e., disordered) voids include selectively depositing a polymer composition or a polymeric precursor composition to form voids in situ, or depositing a polymer or polymeric precursor composition containing a templating agent and then selectively removing the templating agent, while a regular (i.e., ordered) arrangement of voids may be formed by self-assembly or various lithography techniques.

In accordance with various embodiments, an example method for fabricating a nanovoided polymer may include (i) depositing a mixture including a curable material and at least one non-curable (e.g., non-polymeric) component onto a substrate, (ii) processing the mixture to form a cured polymer material including at least one non-polymeric component in a plurality of defined regions, and (iii) removing at least a portion of the at least one non-polymeric component from the cured polymer material to form a nanovoided polymer material on the substrate.

In some examples, depositing the mixture may include printing the mixture onto the substrate. Printing may include at least one of inkjet printing or silkscreen printing, for example. In some examples, processing the mixture may include curing the curable material to form the cured polymer material. A curing source and/or heat source, for example, may be used to process the mixture and may include an energized array of filaments that may generate actinic energy to heat the curable material. In some embodiments, removing at least the portion of the at least one non-polymeric component from the cured polymer material may lead to the formation of a plurality of voids defined in the nanovoided polymer material.

In some embodiments, the at least one non-curable component may include a solvent. The curable material may include at least one of an acrylate, a styrene, a polyester, a polycarbonate, an epoxy, a halogenated polymer, or a silicone material, as well as mixtures thereof. Further, processing the mixture may include curing the curable material to form the cured polymer material, the cured polymer material including the solvent in the plurality of defined regions. Moreover, removing at least a portion of the at least one non-polymeric component from the cured polymer material may include removing at least a portion of the solvent from the cured polymer material to form the nanovoided polymer material on the electrode.

In some examples, the at least one non-curable component may include a cavitation agent. Further, processing the mixture may include exposing the mixture to light sufficient to cure the curable material and decompose the cavitation agent to form the cured polymer material, the cured polymer material including at least one decomposition product of the cavitation agent in the plurality of defined regions. Further, removing at least the portion of the at least one non-polymeric component from the cured polymer material may include removing at least a portion of the at least one decomposition product from the cured polymer material.

In various embodiments, a method for fabricating a nanovoided polymer may include vaporizing a curable material and depositing the vaporized curable material onto a substrate. The method may further include (i) combining the curable material with at least one non-curable component to form a mixture including the curable material and the at least one non-curable component on the substrate, (ii) processing the mixture to form a cured polymer material including at least one non-polymeric component in a plurality of defined regions, and (iii) removing at least a portion of the at least one non-polymeric component from the cured polymer material to form a nanovoided polymer material on the substrate. In some embodiments, removing at least the portion of the at least one non-polymeric component from the cured polymer material may form a plurality of voids defined in the nanovoided polymer material.

Moreover, (i) vaporizing the curable material may include vaporizing the curable material in a vaporizer, and (ii) depositing the vaporized curable material onto the substrate may include depositing the vaporized curable material while continuously changing the position of the substrate with respect to the vaporizer.

In some embodiments, the at least one non-curable component may include a solvent. Further, processing the mixture may include (i) curing the curable material to form the cured polymer material, the cured polymer material including the solvent in the plurality of defined regions, and (ii) removing at least the portion of the at least one non-polymeric component from the cured polymer material may include removing at least a portion of the solvent from the cured polymer material to form the nanovoided polymer material on the substrate.

In another aspect, the at least one non-curable component may include a cavitation agent. Further, processing the mixture may include exposing the mixture to light sufficient to cure the curable material and decompose the cavitation agent to form the cured polymer material, the cured polymer material including at least one decomposition product of the cavitation agent in the plurality of defined regions. In this example, removing at least the portion of the at least one non-polymeric component from the cured polymer material may include removing at least a portion of the at least one decomposition product from the cured polymer material.

In some embodiments, the application of a voltage to a nanovoided polymer layer may change the topology of the voids within the polymer. In accordance with various embodiments, the manipulation of the nanovoid topology can be used to actively control the effective refractive index of the nanovoided polymer layer.

As will be explained in greater detail below, embodiments of the instant disclosure relate to switchable optical elements that include a nanovoided polymer layer. For instance, the nanovoided polymer layer may exhibit a first refractive index in an unactuated state and a second refractive index different than the first refractive index in an actuated state. Capacitive actuation, mechanical actuation, or actuation of the nanovoided polymer layer by other methods may be used to reversibly manipulate the void topology and hence the refractive index of the polymer layer.

Figure 3B:
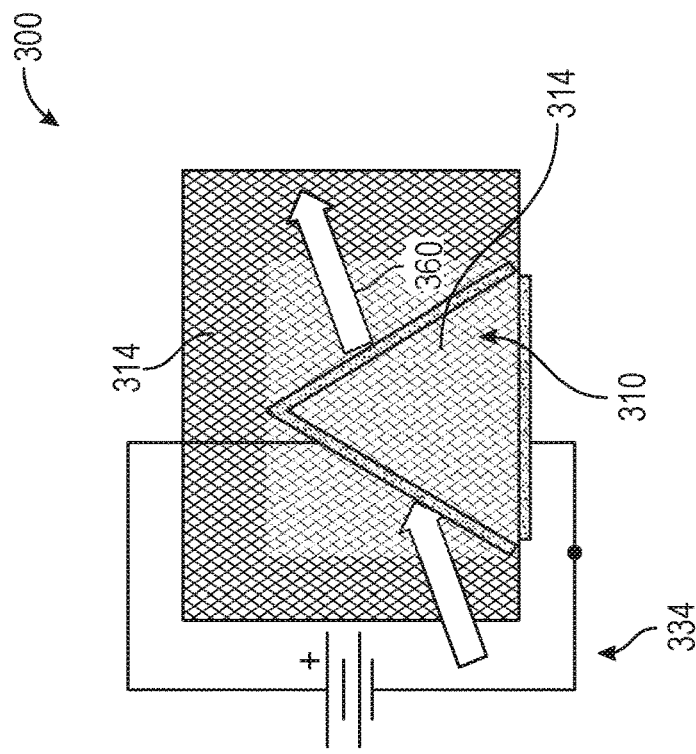
FIG. 3B is a schematic diagram showing the change in the path of light through the optical element of FIG. 3A following actuation and compression of the structured layer of nanovoided polymer material according to certain embodiments.
Figure 3A:
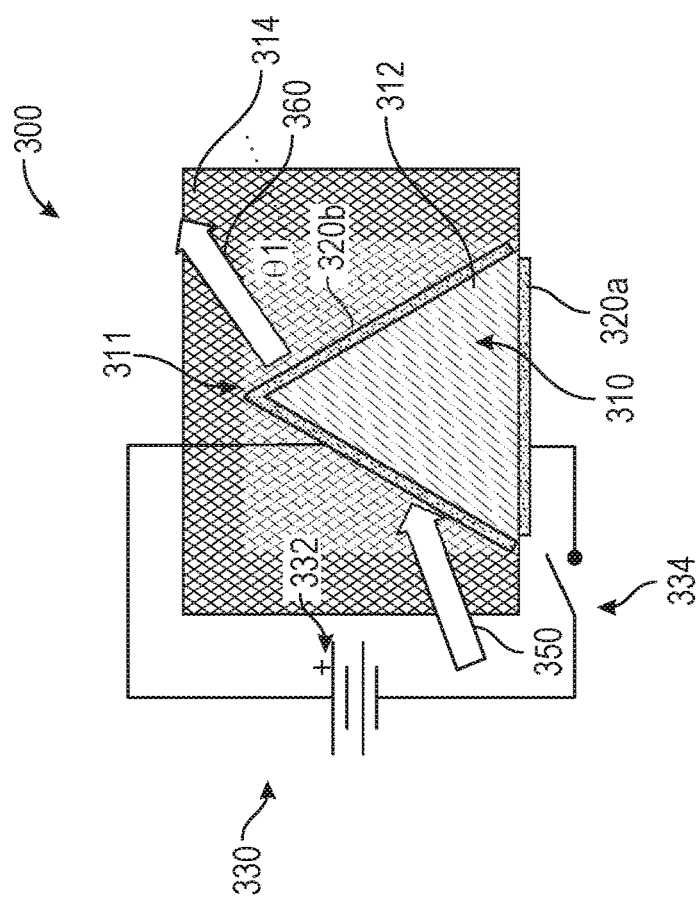
FIG. 3A is a schematic diagram showing an optical element having a structured polymer layer that includes a nanovoided polymer material and a dense polymer layer overlying the structured polymer layer according to some embodiments.
Figure 4B:
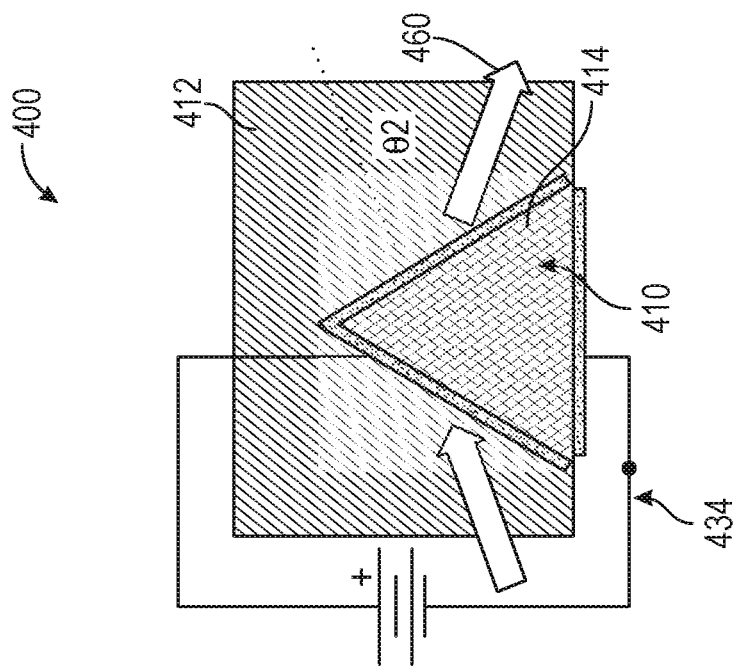
FIG. 4B is a schematic diagram showing the change in the path of light through the optical element of FIG. 4A following capacitive actuation and compression of the structured layer of nanovoided polymer material according to some embodiments.
Figure 4A:
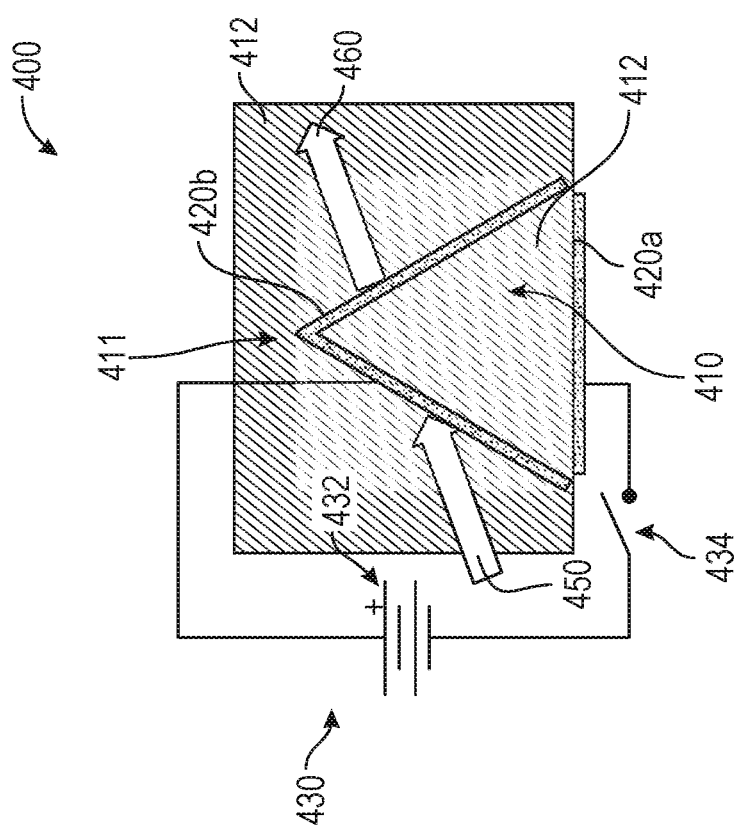
FIG. 4A is a schematic diagram of an optical element having a structured polymer layer that includes a nanovoided polymer material and a polymer layer overlying the structured polymer layer that also includes a nanovoided polymer material according to some embodiments.
Figure 5:
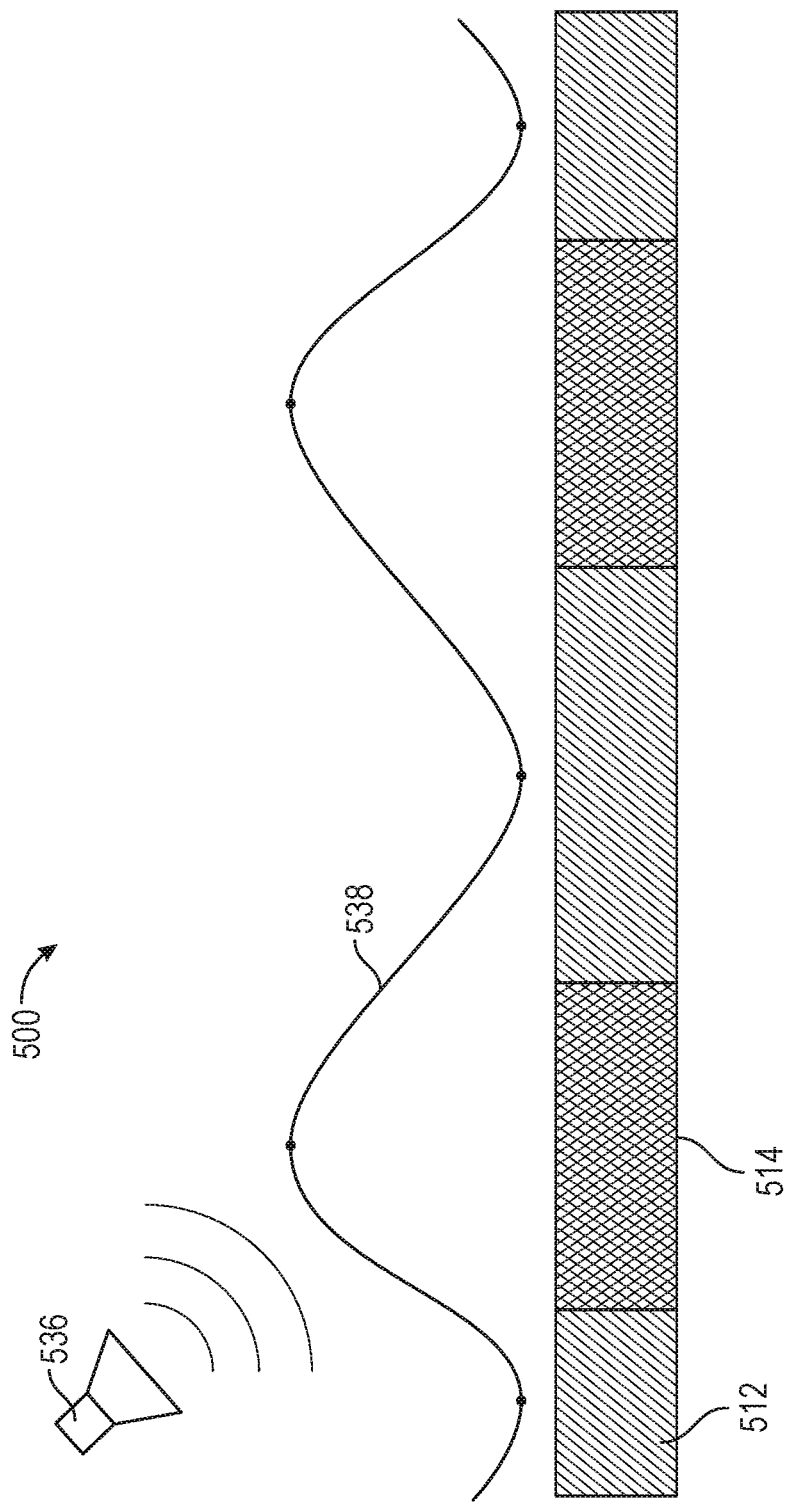
FIG. 5 is a schematic diagram showing the localized acoustic wave actuation of a layer of nanovoided polymer material according to certain embodiments.
Figure 6:
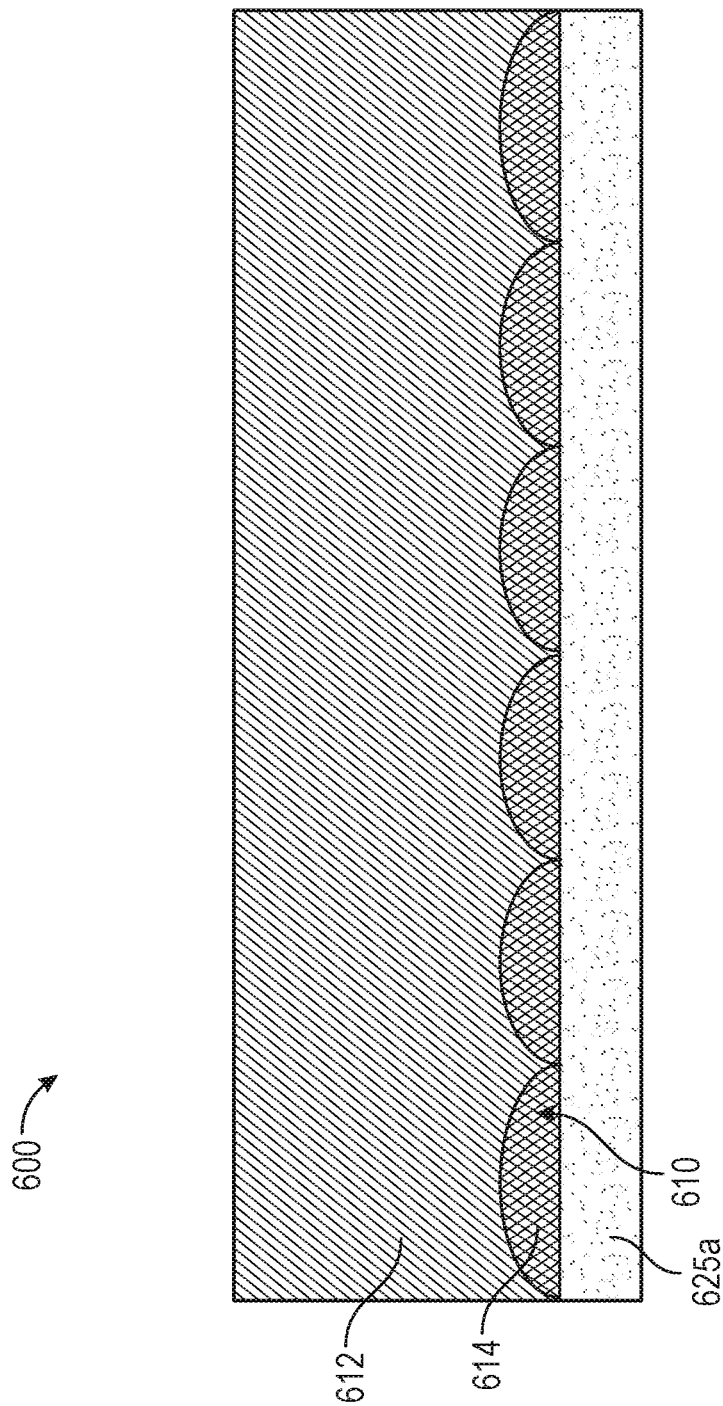
FIG. 6 is a schematic diagram showing an example diffuser lens including a structured polymer layer and an overlying layer of a nanovoided polymer material according to some embodiments.

The following will provide, with reference to FIGS. 1-10, a detailed description of methods and systems related to the manufacture and implementation of nanovoided tunable optics. The discussion associated with FIGS. 1-4B includes a description of the effect of capacitive actuation on the optical properties of optical elements that include a nanovoided polymer layer and an adjacent, e.g., overlying, dielectric layer. The discussion associated with FIG. 5 schematically illustrates localized actuation of a nanovoided polymer layer using acoustic waves. FIG. 6 describes an example lens structure operable as a switchable diffuser lens that includes an actuatable nanovoided polymer layer and a structured dielectric layer disposed over a substrate. The discussion associated with FIG. 7A and FIG. 7B describes the formation of a graded index lens. The discussion associated with FIGS. 8A-9B describes the operation of switchable index devices in accordance with some embodiments. The discussion associated with FIG. 10 describes an example method for manufacturing an optical element having a nanovoided polymer layer.

In accordance with various embodiments, a nanovoided polymer layer is disposed between a primary electrode and a secondary electrode. According to some embodiments, an optical element may include a primary electrode, a secondary electrode overlapping at least a portion of the primary electrode, and a nanovoided polymer layer disposed between and abutting the primary electrode and the secondary electrode.

The application of a voltage between the electrodes can cause compression of the nanovoided polymer layer in the direction of the applied electric field and an associated expansion or contraction of the nanovoided polymer layer in one or more transverse dimensions. Such actuation can be used to manipulate the topology of nanovoids within the polymer matrix and, in turn, the effective refractive index of the polymer layer.

Figure 1A:
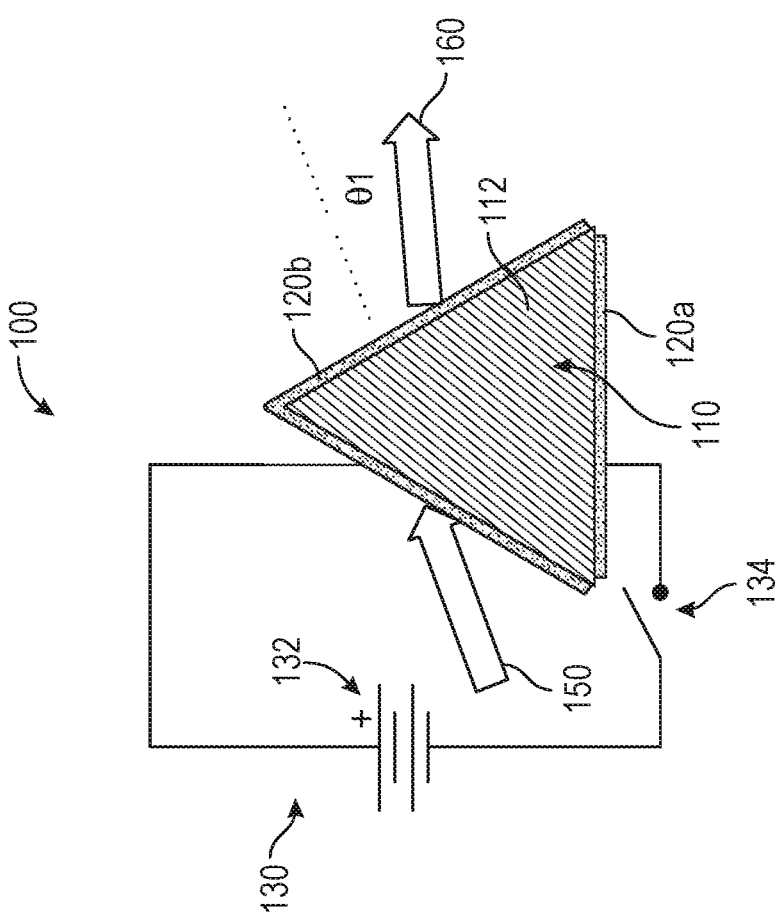
FIG. 1A is a schematic diagram showing an optical element having a structured polymer layer that includes a nanovoided polymer material according to some embodiments.

Referring to FIG. 1A, an example optical element 100 includes a structured polymer layer 110. A "structured polymer layer" may, in some examples, have a planar or a non-planar geometry and in the illustrated embodiment of FIG. 1A and FIG. 1B, may form a prismatic or pyramidal shape, although other 3D geometries are contemplated. The structured layer 110 may be formed over a substrate (not shown) by selective deposition of a suitable polymer material or by using a patterning technique such as photolithography, as known to those skilled in the art. In various embodiments, the structured layer 110 may include a nanovoided polymer 112.

The nanovoided polymer 112 may be disposed over, e.g., directly over, a primary electrode 120a, and a secondary electrode 120b may be disposed over, e.g., directly over, the nanovoided polymer 112. In some embodiments, the electrodes (e.g., the primary electrode 120a and the secondary electrode 120b) may include metals such as aluminum, gold, silver, tin, copper, indium, gallium, zinc, and the like. Other conductive materials may be used, including carbon nanotubes, graphene, transparent conductive oxides (TCOs, e.g., indium tin oxide (ITO), zinc oxide (ZnO), etc.), and the like.

The electrodes (e.g., the primary electrode 120a and the secondary electrode 120b) may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In further aspects, the electrodes may be manufactured using a thermal evaporator, a sputtering system, a spray coater, a spin-coater, printing, stamping, and the like.

In some embodiments, the electrodes (e.g., the primary electrode 120a and the secondary electrode 120b) may have a thickness of approximately 1 nm to approximately 1000 nm, with an example thickness of approximately 10 nm to approximately 50 nm. The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, or approximately 99%, including ranges between any of the foregoing values.

Some of the electrodes may be designed to allow healing of electrical breakdown (e.g., associated with the electric breakdown of elastomeric polymer materials). A thickness of an electrode that includes a self-healing electrode (e.g., an aluminum electrode) may be approximately 20 nm. The electrodes may be configured to stretch elastically. In such embodiments, the electrodes may include TCOs, graphene, carbon nanotubes, and the like. In other embodiments, relatively rigid electrodes (e.g., electrodes including a metal such as aluminum) may be used.

A control circuit 130 including a voltage source 132 and a switch 134 may be configured to apply an electrical bias to the structured layer 110 via electrodes 120a, 120b. As shown in FIG. 1A, with switch 134 open and structured layer 110 unbiased, incident light 150 directed at the optical element 100, i.e., structured layer 110, may pass through the optical element 100 and emerge as refracted light 160. Depending on the relative refractive indices of the nanovoided polymer 112 and a dielectric environment 111 proximate to the structured layer 110 (e.g., a dielectric medium, such as air overlying the secondary electrode 120b), the refracted light may exit the optical element 100 at a refracted angle ($\Theta 1$) with respect to the direction of the incident light 150, based on Snell's Law.

Referring to FIG. 1B, nanovoided polymer 112 may be actuated using electrostatic force by closing switch 134. In response to actuation and the attendant compression of the nanovoided polymer 112, the void volume within the nanovoided polymer 112 may change (e.g., decrease) to form a dense polymer 114, which may change the effective refractive index of the optical element 100.

In the embodiment illustrated in FIGS. 1A and 1B, the dielectric environment 111 overlying the structured element 110 may have a refractive index less than the effective refractive index of the nanovoided polymer material 112. Without wishing to be bound by theory, compression of the nanovoided polymer 112 and the attendant decrease in the void volume within the nanovoided polymer 112 may increase the effective refractive index of the nanovoided polymer 112, which may increase the refracted angle ($\Theta 2$) of refracted light 160 exiting the optical element 100 relative to $\Theta 1$, i.e., $\Theta 2 > \Theta 1$. By re-opening switch 134, the refracted angle of the light path may return to $\Theta 1$. Thus, according to various embodiments, actuation of the nanovoided polymer 112 can be used to reversibly manipulate the interaction of light with optical element 100.

Figure 2B:
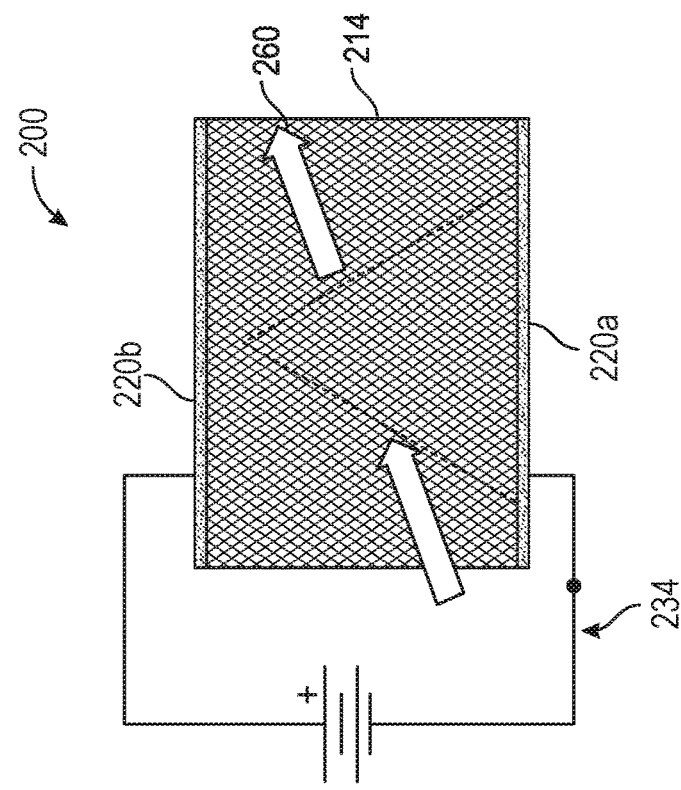
FIG. 2B is a schematic diagram of the optical element of FIG. 2A following capacitive actuation and compression of the overlying nanovoided polymer layer and the attendant change in the path of light through the optical element according to certain embodiments.
Figure 2A:
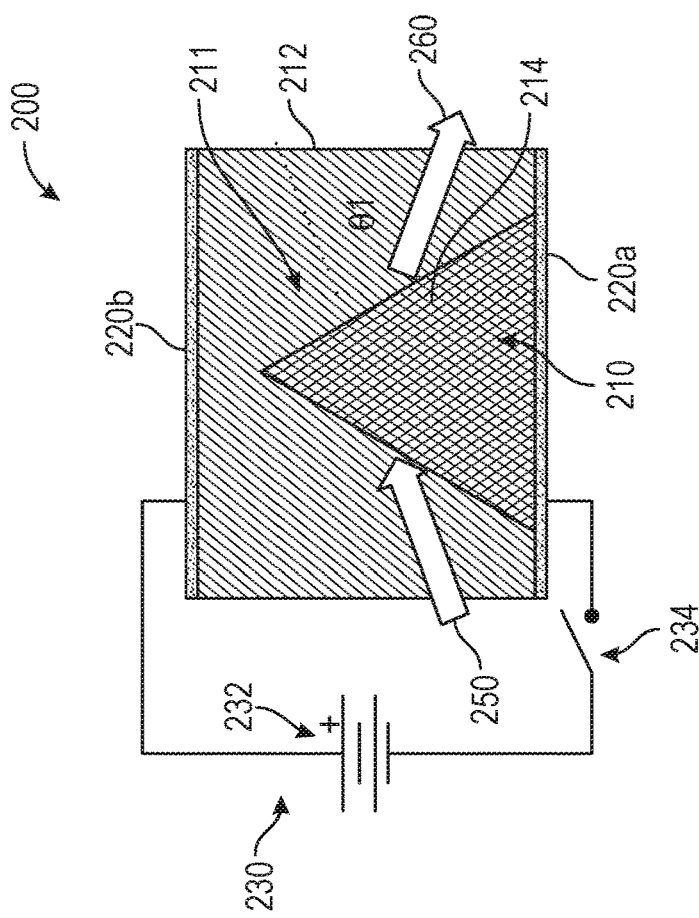
FIG. 2A is a schematic diagram showing an optical element having a structured polymer layer and a dielectric layer overlying the structured polymer layer that includes a nanovoided polymer material according to some embodiments.

Referring to FIG. 2A and FIG. 2B, illustrated is a further example of a switchable optical element. Optical element 200 includes a structured polymer layer 210, which may include an un-voided (substantially dense) polymer 214. Optical element 200 further includes a dielectric environment 211 disposed over, e.g., directly over the dense polymer layer 214. Dielectric environment 211 may include, for example, a nanovoided polymer layer 212. As shown, the nanovoided polymer 212 may be disposed over portions of a primary electrode 220a, and a secondary electrode 220b may be disposed over the nanovoided polymer 212. Circuit 230, including a voltage source 232 and a switch 234, is configured to apply an electrical bias to the nanovoided polymer layer 212.

Referring to FIG. 2A, with switch 234 open and nanovoided polymer layer 212 unbiased, incident light 250 directed at the optical element 200, i.e., structured layer 210, may interact with optical element 200 and emerge as refracted light 260. Depending on the relative refractive indices of the dense polymer layer 214 and the overlying nanovoided polymer 212, the refracted light 260 may exit the structured polymer layer 210 at a refracted angle (Θ1).

By closing switch 234, a voltage may be applied across the nanovoided polymer layer 212 and the nanovoided polymer 212 may be compressed by electrostatic forces between the primary and secondary electrodes 220a, 220b. In the embodiment illustrated in FIG. 2B, compression of the nanovoids and the resulting compaction of the nanovoided polymer 212 may form a substantially dense polymer layer 214 having a uniform refractive index between the electrodes 220a, 220b such that incident light 250 emerges from optical element 200 as substantially un-refracted light 260.

As will be appreciated, in the embodiment illustrated in FIGS. 2A and 2B, under compression, the effective refractive index of the nanovoided polymer 212 may be tuned to match the refractive index of the dense polymer layer 214. In this regard, in some embodiments, the polymer composition of the nanovoided polymer layer 212 may be substantially the same as the polymer composition of the dense polymer layer 214, which may facilitate index-matching. In additional examples, the composition of the dense polymer layer 214 may differ from the matrix composition of the nanovoided polymer layer 212.

Illustrated in FIG. 3A and FIG. 3B is a switchable optical element according to further embodiments. Optical element 300 includes a structured polymer layer 310 disposed over a primary electrode 320a, and a secondary electrode 320b disposed over the structured polymer layer 310. The structured polymer layer 310 may include a nanovoided polymer 312, for example, where the primary electrode 320a and the secondary electrode 320b are each in direct contact with the nanovoided polymer 312.

Circuit 330, including a voltage source 332 and a switch 334, is configured to apply a voltage across the structured polymer layer 310 via electrodes 320a, 320b. Optical element 300 further includes a dielectric environment 311. Dielectric environment 311 may include a dense polymer layer 314 disposed over the structured polymer layer 310, i.e., directly over secondary electrode 320b.

Referring to FIG. 3A, the effective refractive index of the nanovoided polymer 312 may be less than the refractive index of the dense polymer layer 314 such that, with switch 334 open and the nanovoided polymer 312 unbiased, incident light 350 may exit the optical element 300 at a refracted angle (Θ1) with respect to the direction of the incident light 350 in accordance with Snell's Law.

With reference to FIG. 3B, by closing switch 334, a voltage may be applied across the nanovoided polymer layer 312 and the nanovoided polymer 312 may be compressed by electrostatic forces between the primary and secondary electrodes 320a, 320b. Compression of the nanovoids and the resulting compaction of the nanovoided polymer 312 may form a substantially dense polymer layer 314 having a uniform refractive index between the electrodes 320a, 320b such that incident light 350 emerges from optical element 300 as substantially un-refracted light 360. That is, in embodiments where the index of refraction of the actuated nanovoided polymer matches that of the overlying dense polymer layer 314, no refraction will occur.

A still further example switchable optical element is illustrated schematically in FIG. 4A and FIG. 4B. Optical element 400 includes a structured polymer layer 410 disposed over a primary electrode 420a, and a secondary electrode 420b disposed over the structured polymer layer 410. The structured polymer layer 410 may include a nanovoided polymer 412, for example, where the primary electrode 420a and the secondary electrode 420b are each in direct contact with the nanovoided polymer 412.

Circuit 430, including a voltage source 432 and a switch 434, is configured to apply a voltage across the structured polymer layer 410 via electrodes 420a, 420b. Optical element 400 further includes a dielectric environment 411 disposed over the structured polymer layer 410, i.e., directly over secondary electrode 420b. Dielectric environment 411 may include a nanovoided polymer layer 412. As shown in the un-actuated state of FIG. 4A, the nanovoided polymer within the structured element 410 and the nanovoided polymer within the dielectric environment 411 may be index-matched such that incident light 450 initially emerges from optical element 400 as un-refracted light 460.

With reference to FIG. 4B, by closing switch 434, a voltage may be applied across the nanovoided polymer layer 412 within structured element 410 and the nanovoided polymer 412 may be compressed by electrostatic forces between the primary and secondary electrodes 420a, 420b. Compression of the nanovoids and the resulting compaction of the nanovoided polymer 412 to form dense polymer 414 may decrease the effective refractive index within the structured element 410 such that incident light 450 is refracted and exits structured element 410 at a refracted angle (Θ2) with respect to the direction of the incident light 450 in accordance with Snell's Law.

The foregoing embodiments illustrate example optical elements where a nanovoided polymer layer is capacitively actuated. As disclosed herein, various methods in addition to capacitive actuation may be used to actuate a nanovoided layer and thus impact its effective refractive index by manipulating the topology of the nanovoids therein. Mechanical compression, for instance, such as the application of a uniaxial force, may be used to actuate the nanovoided polymer layer. Referring to FIG. 5, for example, shown schematically is the localized acoustic wave-based actuation of a layer of nanovoided polymer material 512 according to various embodiments.

In some embodiments, an acoustic wave 538 emanating from a transmitter 536 may include a standing wave pattern, e.g., formed by interfering two or more beams of light. Because the locations of the minima and maxima in a standing wave depend on the wavelength of the light, regions of absorption of the standing wave 538 effective to compress the nanovoided layer 512 and form a dense polymer layer 514 may also vary with the wavelength, thus enabling a process for forming an optical element having spatially-defined dense polymer regions adjacent to nanovoided regions. For instance, in accordance with some embodiments, an acoustic wave may be used to locally tune the refractive index of a nanovoided layer independent of conventional patterning techniques such as photolithography. This approach is analogous to an acousto-optic deflector where the standing waves may function as a phase grating.

As will be appreciated, a layer such as a structured layer of an actuatable nanovoided polymer may be incorporated into a variety of optical element architectures. Referring to FIG. 6, shown is a schematic diagram of an example diffuser lens 600 including, from bottom to top, a primary substrate 625a, a structured polymer layer 610, and an overlying layer of a nanovoided polymer material 612. The primary substrate 625a may be a transparent glass substrate, for example, and the structured polymer layer 610 may include a dense polymer material 614. In some embodiments, the composition of the dense polymer layer 614 may be the substantially the same as the matrix composition of the nanovoided polymer layer 612. In additional examples, the composition of the dense polymer layer 614 may differ from the matrix composition of the nanovoided polymer layer 612.

In the illustrated structure of FIG. 6, the effective refractive index of the nanovoided polymer layer 612 may be different than the refractive index of the dense polymer material 614 such that light passing through the diffuser lens 600 may be scattered. In turn, refractive index matching of the nanovoided polymer layer 612 and the dense polymer material 614 may be used to decrease or eliminate the scattering effect, as desired. As will be appreciated, according to some embodiments, refractive index matching of the nanovoided polymer layer 612 and the dense polymer material 614 may be achieved through actuation of the nanovoided polymer layer 612.

According to further embodiments, actuatable nanovoided polymer layers and structures may be used to create graded index architectures, such as graded index lenses. In such architectures, discrete regions of dense polymer and nanovoided polymer may be formed and the nanovoided regions actuated to effect a local change in the refractive index and, as a result, a change in the interaction of light with the graded index architecture.

Figure 7A:
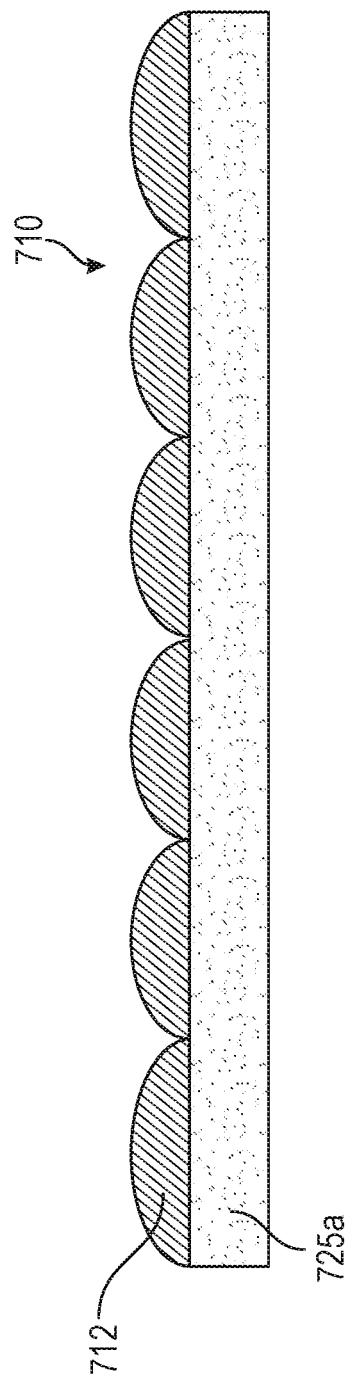
FIG. 7A is a schematic diagram showing a low-profile graded index lens at an intermediate stage of fabrication including a structured layer of a nanovoided polymer material disposed over a primary substrate according to certain embodiments.

Referring to FIG. 7A, for example, a low profile graded index lens at an intermediate stage of fabrication includes a structured layer 710 of a nanovoided polymer 712 disposed over a primary substrate 725a. The primary substrate 725a may be, for example, a transparent glass substrate.

Figure 7B:
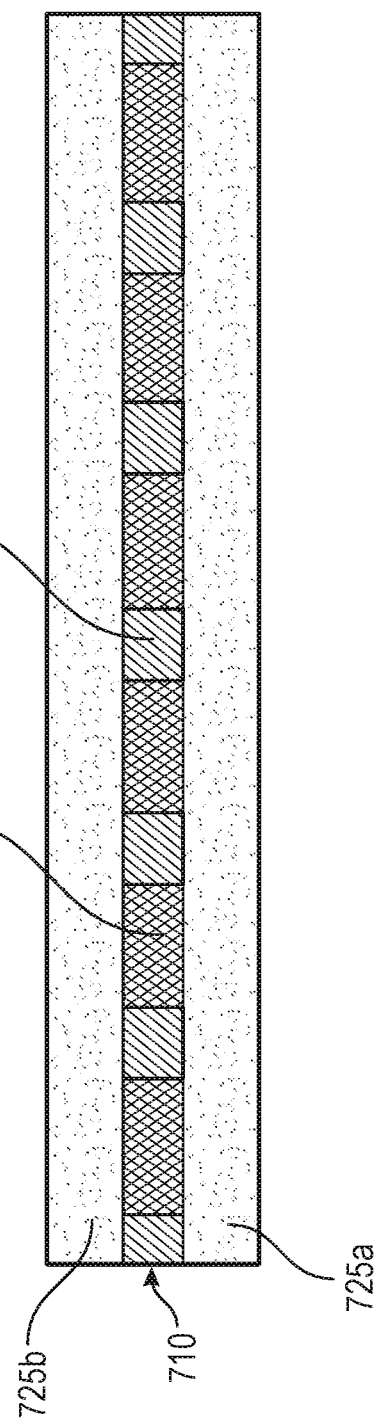
FIG. 7B shows the structure of FIG. 7A following the formation of a secondary substrate over the structured polymer layer and the compression of the nanovoided polymer material in accordance with some embodiments.

With reference to FIG. 7B, the periodicity of the structured layer 710 may be incorporated into a planar lens structure by forming a secondary substrate 725b over the nanovoided polymer 712 and mechanically compressing the nanovoided polymer 712. In some embodiments, between the primary and secondary substrates 725a, 725b, thicker regions of the nanovoided polymer layer 712 may be compressed more than adjacent thinner regions, resulting in the formation of alternating dense polymer regions 714 and nanovoided polymer regions 712, respectively. As will be appreciated, the density and hence the refractive index may vary continuously between the dense and nanovoided polymer regions 714, 712. The resulting structure may function as a grating or a diffractive optical element, e.g., operable for beam shaping or beam steering.

Referring to FIG. 8A and FIG. 8B, illustrated is a further example of a switchable optical element. The optical element includes a structured polymer layer 810, which may include an un-voided (substantially dense) polymer 814. The optical element further includes a dielectric environment 811 disposed over, e.g., directly over the dense polymer layer 814. Dielectric environment 811 may include, for example, a nanovoided polymer layer 812. The nanovoided polymer 812 may be disposed over portions of a primary electrode 820a, and a secondary electrode 820b may be disposed over the nanovoided polymer 812. Circuit 830, including a voltage source 832 and a switch 834, is configured to apply an electrical bias between the primary and secondary electrodes 820a, 820b to the nanovoided polymer layer 812.

Referring to FIG. 8A, with switch 834 open and nanovoided polymer layer 812 unbiased, incident light 850 directed at the structured layer 810, may be refracted at one or more interfaces between the structured layer 810 and the dielectric environment 811, i.e., between the dense polymer 814 and the nanovoided polymer 812 and emerge as refracted light 860. In the illustrated embodiment, the direction of the refracted light 860 may be opposite to that of the incident light 850.

By closing switch 834, a voltage may be applied across the nanovoided polymer layer 812 and the nanovoided polymer 812 may be compressed by electrostatic forces between the primary and secondary electrodes 820a, 820b. In the embodiment illustrated in FIG. 8B, compression of the nanovoids and the resulting compaction of the nanovoided polymer 812 may form a substantially dense polymer layer 814 having a uniform refractive index between the electrodes 820a, 820b such that incident light 850 passes through the optical element as substantially un-refracted light 860.

As will be appreciated, in some embodiments, the polymer composition of the nanovoided polymer layer 812 may be substantially the same as the polymer composition of the dense polymer layer 814, which may facilitate such indexmatching. In this regard, in the embodiment illustrated in FIGS. 8A and 8B, under compression, the effective refractive index of the nanovoided polymer 812 may be tuned to match the refractive index of the dense polymer layer 814. In additional examples, the composition of the dense polymer layer 814 may differ from the matrix composition of the nanovoided polymer layer 812.

Referring to FIG. 9A, shown is a schematic diagram of an example optical element including a structured polymer material layer 910 with upper and lower cladding layers of a nanovoided polymer 912 disposed over and under the structured polymer material layer 910. A primary electrode 920a underlies each nanovoided polymer cladding layer 912 and a secondary electrode 920b overlies each nanovoided polymer cladding layer 912. A circuit 930, including a voltage source 932 and a switch 934, is configured to apply an electrical bias to each respective nanovoided polymer cladding layer 912 via a corresponding pair of primary and secondary electrodes 920a, 920b.

Referring to FIG. 9A, with switches 934 open and each nanovoided polymer cladding layer 912 unbiased, the effective refractive index of each cladding layer 912 may be less than the refractive index of the structured polymer material layer 910 such that incident light 950 may exhibit total internal reflection within the structured polymer material layer 910.

Referring to FIG. 9B, by closing switches 934, a voltage may be applied across each of the nanovoided polymer cladding layers 912 such that the nanovoided polymer cladding layers 912 may be compressed by electrostatic forces between respective pairs of primary and secondary electrodes 920a, 920b. Compression and the accompanying loss of void volume may form substantially dense polymer layers 914 having a refractive index equal to the refractive index of the dense polymer layer 914 within structured polymer material layer 910 such that incident light 950 passes through the optical element as substantially un-refracted light.

Although the extreme conditions of total internal reflection (TIR) and total transmission are illustrated respectively in FIG. 9A and FIG. 9B, it will be appreciated that the relative degrees of TIR and transmission may vary continuously by controlling the extent of polymer actuation.

Figure 10:
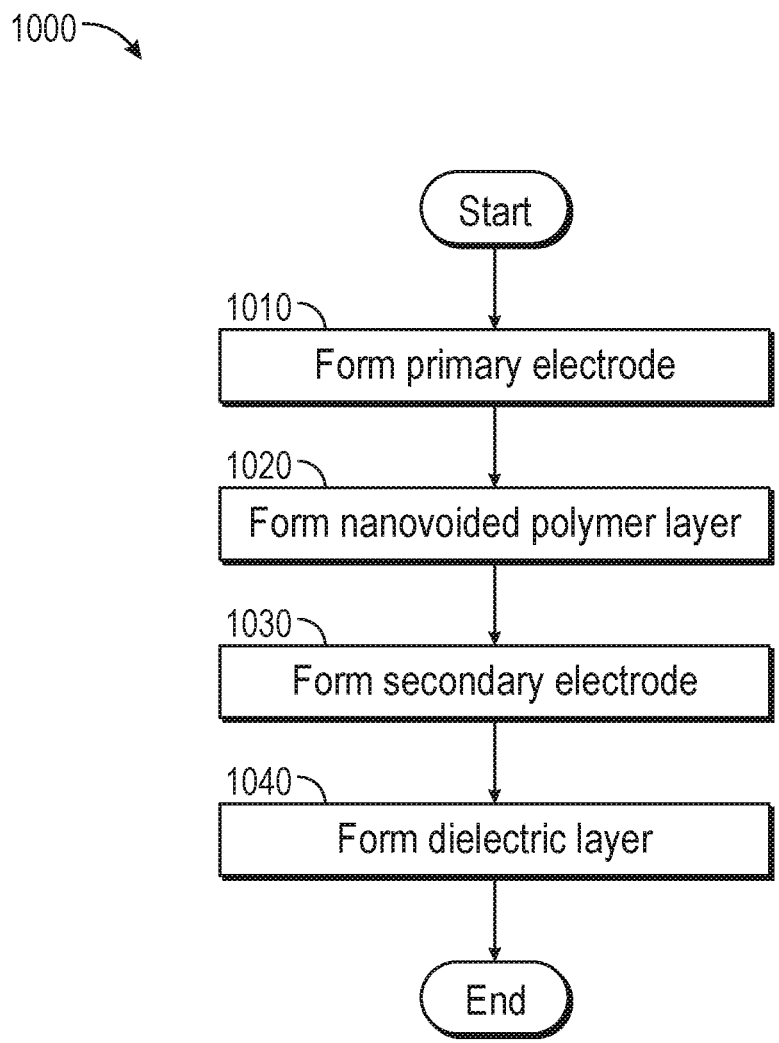
FIG. 10 is a flow chart illustrating an example method of manufacturing an optical element including a nanovoided polymer layer.

Referring to FIG. 10, illustrated is a flow chart detailing an example method 1000 of manufacturing an optical element including a nanovoided polymer layer. In accordance with various embodiments, at step 1010, a primary electrode is formed, for example, over a substrate. At step 1020, a nanovoided polymer layer is formed over, e.g., directly over, the primary electrode. At step 1030, a secondary electrode is formed over, e.g., directly over, the nanovoided polymer layer and, at step 1040, a dielectric layer is formed over the secondary electrode.

In some embodiments, the nanovoided polymer layer may be configured to have a first refractive index when a first voltage is applied between the primary electrode and the secondary electrode and a second refractive index different from the first refractive index when a second voltage different from the first voltage is applied between the primary electrode and the secondary electrode.

The methods and systems shown and described herein may be used to form optical elements having a single layer or multiple layers of a nanovoided polymer. Each of a plurality of electrode/electroactive polymer element/electrode stacks, for example can be independently configured to have a desired void size and void size distribution, as well as shape, alignment, and spacing between layers. Such complex arrangements can enable dynamic, localized control of the refractive index of an optical element.

Embodiments of the present disclosure may include or be implemented in conjunction with an artificial reality system. Artificial reality is a form of perceived reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in artificial reality and/or are otherwise used (e.g., perform activities) in artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical element comprising:
 a primary electrode;
 a secondary electrode overlapping at least a portion of the primary electrode; and
 a nanovoided polymer layer disposed between and abutting the primary electrode and the secondary electrode, the nanovoided polymer layer having:
  a first refractive index in an unactuated state; and
  a second refractive index different than the first refractive index in an actuated state.

2. The optical element of claim 1, further comprising a structured polymer layer.

3. The optical element of claim 2, wherein the structured polymer layer comprises the nanovoided polymer layer.

4. The optical element of claim 1, further comprising a dielectric layer adjacent to the nanovoided polymer layer.

5. The optical element of claim 4, wherein the dielectric layer comprises an un-voided polymer layer.

6. The optical element of claim 4, wherein the dielectric layer comprises a second nanovoided polymer layer.

7. The optical element of claim 4, wherein the dielectric layer comprises air.

8. The optical element of claim 4, wherein the first refractive index is equal to a refractive index of the dielectric layer.

9. The optical element of claim 4, wherein the second refractive index is equal to a refractive index of the dielectric layer.

10. The optical element of claim 1, wherein the nanovoided polymer layer comprises a uniform void topology.

11. The optical element of claim 1, wherein the optical element comprises a portion of a switchable diffuser lens.

12. The optical element of claim 1, wherein light incident on the optical element exhibits total internal reflection within the optical element.

13. An optical element comprising:
 a primary electrode;
 a secondary electrode overlapping at least a portion of the primary electrode;
 a nanovoided polymer layer disposed between and abutting the primary electrode and the secondary electrode; and
 a dielectric layer adjacent to the nanovoided polymer layer,
 wherein:
  the nanovoided polymer layer has a first refractive index when a first voltage is applied between the primary electrode and the secondary electrode; and
  the nanovoided polymer layer has a second refractive index different from the first refractive index when a second voltage different from the first voltage is applied between the primary electrode and the secondary electrode.

14. The optical element of claim 13, wherein the dielectric layer is disposed directly over the nanovoided polymer layer.

15. The optical element of claim 13, wherein the nanovoided polymer layer comprises a structured layer.

16. The optical element of claim 13, wherein the nanovoided polymer layer comprises a non-uniform void topology.

17. A method comprising:
forming a structured nanovoided polymer layer having a first refractive index over a primary electrode;
forming a secondary electrode over the structured nanovoided polymer layer;
forming a dielectric layer over the secondary electrode, wherein the structured nanovoided polymer layer has the first refractive index when a first voltage is applied between the primary electrode and the secondary electrode, and the structured nanovoided polymer layer has the second refractive index when a second voltage different from the first voltage is applied between the primary electrode and the secondary electrode; and
deforming the structured nanovoided polymer layer in at least one dimension to form a deformed nanovoided polymer layer having a second refractive index different from the first refractive index.

18. The method of claim 17, wherein deforming the structured nanovoided polymer layer comprises at least one of capacitive actuation, mechanical actuation, or acoustic actuation.

* * * * *